(12) United States Patent
Shuvalov

(10) Patent No.: US 10,156,592 B2
(45) Date of Patent: Dec. 18, 2018

(54) CURRENT SENSING CIRCUIT AND METHOD

(71) Applicant: FREESCALE SEMICONDUCTOR, INC., Austin, TX (US)

(72) Inventor: Denis Shuvalov, Munich (DE)

(73) Assignee: NXP USA, Inc., Austin, TX (US)

( * ) Notice: Subject to any disclaimer, the term of this patent is extended or adjusted under 35 U.S.C. 154(b) by 563 days.

(21) Appl. No.: 14/983,835

(22) Filed: Dec. 30, 2015

(65) Prior Publication Data

US 2017/0192040 A1    Jul. 6, 2017

(51) Int. Cl.
*G01R 17/16* (2006.01)
*G01R 19/00* (2006.01)

(52) U.S. Cl.
CPC ......... *G01R 17/16* (2013.01); *G01R 19/0092* (2013.01); *H03K 2217/0027* (2013.01)

(58) Field of Classification Search
CPC .... G01R 17/16; G01R 19/0092; G01R 19/15; G01R 1/206; G01R 1/30; H03K 2217/0027; H03K 2217/0054; H03F 2203/45574
See application file for complete search history.

(56) References Cited

U.S. PATENT DOCUMENTS

| | | | |
|---|---|---|---|
| 5,498,984 A | 3/1996 | Schaffer | |
| 7,009,403 B2 | 3/2006 | Graf et al. | |
| 7,034,542 B2 | 4/2006 | Peterson | |
| 7,126,354 B2 | 10/2006 | Deboy et al. | |
| 7,202,694 B2 | 4/2007 | Eberlein | |
| 8,018,213 B2 | 9/2011 | Arndt | |
| 8,237,449 B2 | 8/2012 | Rallabandi et al. | |
| 2006/0028192 A1 | 2/2006 | Ryu et al. | |
| 2006/0255783 A1 | 11/2006 | Chapuis | |
| 2012/0268075 A1 | 10/2012 | Wolf et al. | |
| 2013/0057241 A1 | 3/2013 | Shuvalov | |
| 2016/0124027 A1* | 5/2016 | Sambucco | G01R 19/0092 324/76.11 |
| 2016/0266178 A1* | 9/2016 | Gerna | G01R 19/0092 |

FOREIGN PATENT DOCUMENTS

| | | |
|---|---|---|
| EP | 0 274 995 A1 | 7/1988 |
| EP | 0274995 B1 | 4/1994 |
| EP | 2 515 126 A1 | 10/2012 |
| EP | 2515126 A1 | 10/2012 |

* cited by examiner

*Primary Examiner* — Son Le
*Assistant Examiner* — Dustin Dickinson
(74) *Attorney, Agent, or Firm* — Charlene R. Jacobsen

(57) ABSTRACT

The present application relates to a circuit arrangement for sensing a current. The circuit arrangement comprises a current sense circuit configured to cause the sense current through a sense transistor, wherein the sense current is representative of a load current through a load transistor. The current sense circuit comprises a differential difference amplifier with a first differential input terminal pair coupled across the drain electrode and the source electrode of the load transistor and a second differential input terminal pair coupled across the drain electrode and the source electrode of the sense transistor. The current sense circuit is operable to force the same voltage difference value across the drain electrode and the source electrode of the load transistor as across the drain electrode and the source electrode of the sense transistor.

19 Claims, 4 Drawing Sheets

CURRENT SENSING CIRCUIT AND METHOD

FIELD OF THE INVENTION

The present disclosure relates generally to circuits and methods for current sensing, for use in a variety of applications. In particular, the present invention relates to the field of current sensing of transistor load currents using so-called sense transistors.

BACKGROUND

Current sensing circuits using so-called current sensing transistors (or "sense FETs") have been commonly used for years. Such current sensing techniques may be especially useful when measuring the load current of power field effect transistors (power FETs), which are composed of a plurality of transistor cells as illustrated. Such power field effect transistors have a common drain region for all transistors cells composing the power transistor component. The common drain region is connected by one drain electrode arranged on the back-side of a wafer whereas the source region and the respective source electrodes are contacted on the front-side of the wafer and connected in parallel. The source electrode of a one transistor cell (referred to as "sense cell") may be separately connected to tap a current signal that is representative of the load current flowing through the plurality of transistor cells of the load transistor. Of course a few transistor cells may be connected in parallel to form the sense transistor.

In circuit arrangement including a load transistor/sense transistor pair the sense current of the sense transistor is directly proportional to the load current of the load transistor whereby the factor of proportionality results from the ratio of the current conducting area of the load transistor and the current conducting area of the sense transistor which is (at least approximately) equivalent to the ratio of the number of transistor cells in the load transistor and, respectively, the sense transistor.

However, the differential amplifier responsively coupled to the sense transistor to draw the sense current of the sense transistor to draw the sense current from the sense transistor is usually employed to bias the sense transistor by a negative feedback. The negative feedback to bias the sense transistor is only possible as long as the flow directions of the load current and sense current through the load transistor and sense transistor is the same.

For instance, there are numerous applications switching high-current loads in high-side and low-side domains e.g. DC-DC converters, H-bridges, solid relays and the like. One of widely used approaches to measure a current flowing through the load transistor in the above use cases is to use a sense transistor with scaled down geometries as described above. Usually a negative feedback is employed to bias the sense transistor with a voltage or a current to equalize voltage drop at the sense transistor with the voltage drop at load transistor.

If there is a common terminal between load and sense transistor and they have the same direction of current flows the conventional implementations in the art can be employed for current measurements. In case the current though load transistor varies the flow direction (bi-directional) or it is not feasible to have same direction of current flows in the load transistor and sense transistor the conventional implementations in the art cannot be employed for current measurements.

Hence, there is a need for a current sensing circuits which can be used in case the load current and sense current through the load transistor and sense transistor have different directions.

SUMMARY

The present invention provides a current sense circuit and a circuit arrangement for sensing a current as described in the accompanying claims. SPecific embodiments of the invention are set forth in the dependent claims. These and other aspects of the invention will be apparent from and elucidated with reference to the embodiments described hereinafter.

BRIEF DESCRIPTION OF THE DRAWINGS

The accompanying drawings, which are incorporated herein and form a part of the specification, illustrate the present invention and, together with the description, further serve to explain the principles of the invention and to enable a person skilled in the pertinent art to make and use the invention.

DETAILED DESCRIPTION

Figure 1:
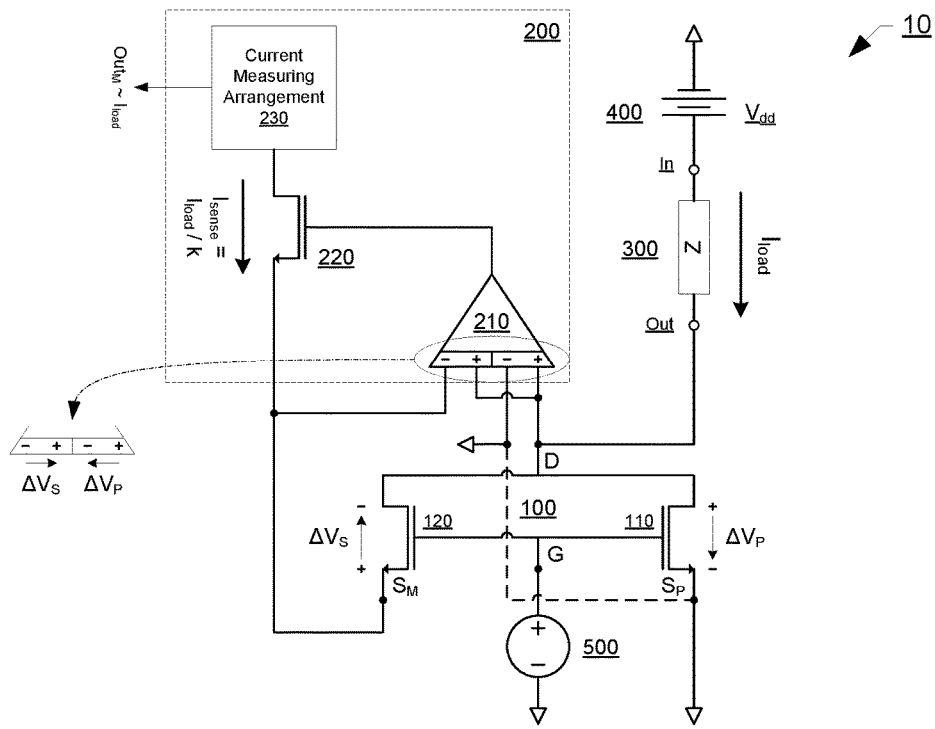
FIG. 1 schematically illustrates a block diagram of an exemplary circuit configuration with a current sense circuit according to an example of the present application.

Embodiments of the present disclosure will be described below in detail with reference to drawings. Note that the same reference numerals are used to represent identical or equivalent elements in figures, and the description thereof will not be repeated. The embodiments set forth below represent the necessary information to enable those skilled in the art to practice the invention. Upon reading the following description in light of the accompanying drawing figures, those skilled in the art will understand the concepts of the invention and will recognize applications of these concepts not particularly addressed herein. It should be understood that these concepts and applications fall within the scope of the disclosure and the accompanying claims.

Referring to FIG. 1, a block diagram of an exemplary circuit configuration with a current sense circuit according to an example of the present application is schematically illustrated.

The exemplary circuit configuration 10 has a load transistor 110 and a current sense circuit 200 being coupled to a sense transistor 120. The load transistor 1110 and the sense transistor 120 are of the same type and are illustrated as n-conductive MOSFETs by way of example in FIG. 1. The load transistor 110 and the sense transistor 120 may be in the form of any other desired transistor components, in particular as IGBTs.

In the example, a first load path terminal of the load transistor 110 is formed by the drain terminal D thereof and a second load path terminal of the transistor 110 is formed by the source terminal $S_P$ thereof. The gate terminal G forms the control terminal of the load transistor 110. The load transistor 110 is connected in series with a load 300 and between the low-potential side Out of the load 300 and ground.

A current source 400 is further connected to the high-potential side In of the load 300 and applies a voltage at the series circuit between the supply potential $V_{dd}$ of the source 400 and the reference potential of ground. This configuration is usually called a low-side-drive configuration. The load transistor 110, when enabled by a control voltage signal 500 at its gate terminal G, will pull the low potential side Out of the load 300 through the load path established between drain terminal D and the source terminal $S_P$ of the load terminal 110 to a low voltage, which substantially corresponds to the reference potential of ground.

The sense transistor 120 likewise has a first sense path terminal, which is formed by the drain terminal D thereof, and a second sense path terminal, which is formed by a source terminal $S_M$ thereof. The control terminal of the sense transistor 120 is formed by the gate terminal G thereof and enables to switch the sense path between the drain terminal D and the source terminal $S_M$ of the sense transistor 120.

The drain terminal D of the sense transistor 120 is connected to the drain terminal D of the load transistor 110. Further, the gate terminal G of the sense transistor 120 is connected to the gate terminal G of the load transistor 110.

In order to measure the current, the sense transistor 120 is operated at substantially the same operating point as the load transistor 110. For this purpose, the sense transistor 120 is coupled to a current sense circuit 200 having a differential difference amplifier, DDA, 210, an auxiliary transistor 220 and a current measurement arrangement 230.

For the purpose of illustrating the mode of operation, the low-potential side Out of the load 300 is connected to the drain terminal D of the load transistor 110, which is the first load path terminal thereof.

In the illustrated example, the auxiliary transistor 220 is likewise in the form of n-conductive MOSFETs, the drain-source path of which is connected in series with the source-drain path of the sense transistor 120. The differential difference amplifier, DDA, 210 is connected between the drain terminal D and the source terminal $S_P$ of the load transistor 110 and further between the drain terminal D and the source terminal $S_M$ of the sense transistor 120. In particular, the drain terminal D and the source terminal $S_P$ of the load transistor 110 are connected to a first differential input terminal pair and the drain terminal D and the source terminal $S_M$ of the sense transistor 120 are connected to a second differential input terminal pair. At the first differential input terminal pair, the potential difference signal $\Delta V_P$ between the drain terminal D and the source terminal $S_P$ of the load transistor 110 is applied and at the second differential input terminal pair, the potential difference signal $\Delta V_S$ between the drain terminal D and the source terminal $S_M$ of the sense transistor 120 is applied.

In the illustrated example, in order to allow the differential difference amplifier 210 to drive the control gate of the auxiliary transistor 220 so as to draw the sense current $I_{sense}$ from the source terminal $S_M$ of the sense transistor 120, the source terminal $S_P$ of the load transistor 110 and the source terminal $S_M$ of the sense transistor 120 are connected inverting inputs of the first and second differential input terminal pairs of the differential difference amplifier, DDA, 210. The (common) drain terminal(s) D of the load transistor 110 and the sense transistor 120 are connected to non-inverting inputs of the first and second differential input terminal pairs. The polarities of the potential difference signal $\Delta V_P$ across the load transistor 110 and the potential difference signal $\Delta V_S$ across the sense transistor 110 as applied to the differential input terminal pairs of the differential difference amplifier, DDA, 210 are different.

The differential difference amplifier, DDA, 210 drives a control gate of the auxiliary transistor 220. The differential difference amplifier, DDA, 210 compares the potential difference signal $\Delta V_P$ between the drain terminal D and the source terminal $S_P$ of the load transistor 110 and the potential difference signal $\Delta V_S$ between the drain terminal D and the source terminal $S_M$ of the sense transistor 120 and sets the auxiliary transistor 220 by an output voltage signal of the differential difference amplifier, DDA, 210 at a control gate terminal of the auxiliary transistor 220 such that these potential differences match. The output voltage signal of the differential difference amplifier, DDA, 210 drives the control gate terminal of the first auxiliary transistor 220 accordingly.

A load current $I_{load}$ flows through the load transistor 110, when the load 300 is connected through the load path switched conductive by the control voltage signal 500 applied to the control gate G of the load transistor 110, while a sense current $I_{sense}$ flows through the sense transistor 120, when the sense path is switched conductive by the control voltage signal 500 applied to the control gate G of the sense transistor 120. The sense current $I_{sense}$ flowing through the source-drain path of the auxiliary transistor 220 is proportional to the load current $I_{load}$ flowing through the load 300 and through the drain-source load path of the load transistor 110, respectively:

$$I_{sense} = I_{load}/k,$$

where k is a proportional factor.

For the purpose of detecting the sense current $I_{sense}$, the current measuring arrangement 230, is connected in series with the auxiliary transistor 220. The current measuring arrangement 230 output a signal $Out_M$, which is proportional to the load current $I_{load}$.

Figure 2:
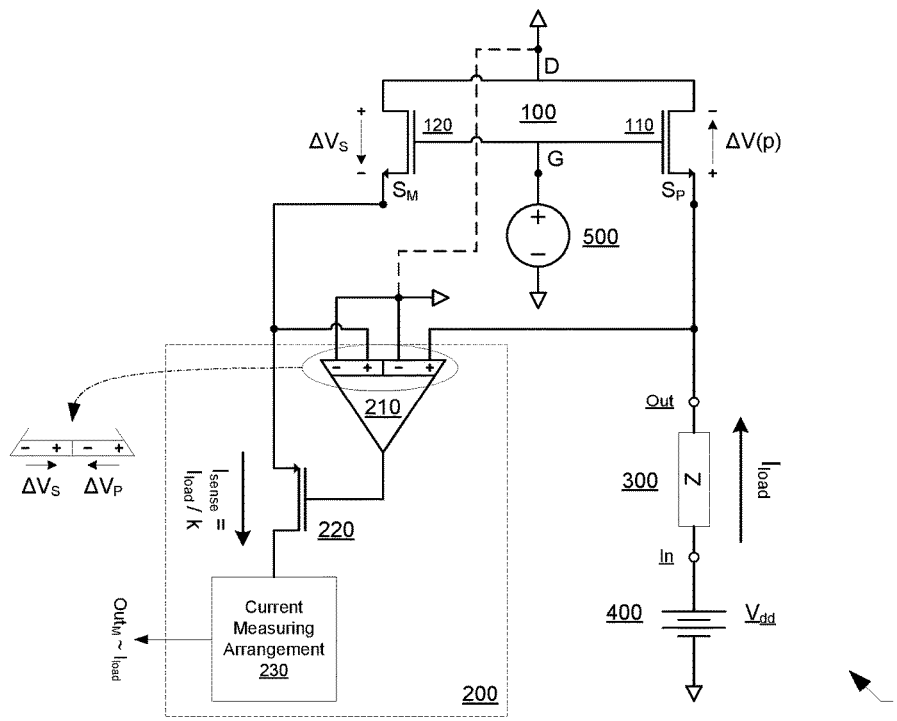
FIG. 2 schematically illustrates a block diagram of another exemplary circuit configuration with a current sense circuit according to an example of the present application.

Referring now to FIG. 2, a block diagram of another exemplary circuit configuration with a current sense circuit according to an example of the present application is schematically illustrated.

The exemplary circuit configuration 20 has a load transistor 110 and a current sense circuit 200 being coupled to a sense transistor 120. The load transistor 1110 and the sense transistor 120 are of the same type and are illustrated as n-conductive MOSFETs by way of example in FIG. 2. The load transistor 110 and the sense transistor 120 may be in the form of any other desired transistor components, in particular as IGBTs.

In the example, a first load path terminal of the load transistor 110 is formed by the drain terminal D thereof and a second load path terminal of the transistor 110 is formed by the source terminal $S_P$ thereof. The gate terminal G forms the control terminal of the load transistor 110. The load transistor 110 is connected in series with a load 300 and between the low-potential side Out of the load 300 and ground.

A current source 400 is further connected to the high-potential side In of the load 300 and applies a voltage at the series circuit between the supply potential $V_{dd}$ of the source 400 and the reference potential of ground. The load transistor 110, when enabled by a control voltage signal 500 at its gate terminal G, will pull the low potential side Out of the load 300 through the load path established between drain terminal D and the source terminal $S_P$ of the load terminal 110 to a low voltage, which substantially corresponds to the reference potential of ground.

The sense transistor 120 likewise has a first sense path terminal, which is formed by the drain terminal D thereof, and a second sense path terminal, which is formed by a source terminal $S_M$ thereof. The control terminal of the sense transistor 120 is formed by the gate terminal G thereof and enables to switch the sense path between the drain terminal D and the source terminal $S_M$ of the sense transistor 120.

The drain terminal D of the sense transistor 120 is connected to the drain terminal D of the load transistor 110. Further, the gate terminal G of the sense transistor 120 is connected to the gate terminal G of the load transistor 110.

In order to measure the current, the sense transistor 120 is operated at substantially the same operating point as the load transistor 110. For this purpose, the sense transistor 120 is coupled to a current sense circuit 200 having a differential difference amplifier, DDA, 210, an auxiliary transistor 220 and a current measurement arrangement 230.

For the purpose of illustrating the mode of operation, the low-potential side Out of the load 300 is connected to the source terminal $S_P$ of the load transistor 110, which is the second load path terminal thereof.

In the illustrated example, the auxiliary transistor 220 is likewise in the form of n-conductive MOSFETs. The drain-source path of the sense transistor 120 is connected in series with the source-drain path of the auxiliary transistor 220. The differential difference amplifier, DDA, 210 is connected between the drain terminal D and the source terminal $S_P$ of the load transistor 110 and further between the drain terminal D and the source terminal $S_M$ of the sense transistor 120. In particular, the drain terminal D and the source terminal $S_P$ of the load transistor 110 are connected to a first differential input terminal pair and the drain terminal D and the source terminal $S_M$ of the sense transistor 120 are connected to a second differential input terminal pair. At the first differential input terminal pair, the potential difference signal $\Delta V_P$ between the drain terminal D and the source terminal $S_P$ of the load transistor 110 is applied and at the second differential input terminal pair, the potential difference signal $\Delta V_S$ between the drain terminal D and the source terminal $S_M$ of the sense transistor 120 is applied.

In the illustrated example, in order to allow the differential difference amplifier 210 to drive the control gate of the auxiliary transistor 220 so as to draw the sense current $I_{sense}$ from the source terminal $S_M$ of the sense transistor 120, the source terminal $S_P$ of the load transistor 110 and the source terminal $S_M$ of the sense transistor 120 are connected non-inverting inputs of the first and second differential input terminal pairs of the differential difference amplifier, DDA, 210. The (common) drain terminal(s) D of the load transistor 110 and the sense transistor 120 are connected to inverting inputs of the first and second differential input terminal pairs. The polarities of the potential difference signal $\Delta V_P$ across the load transistor 110 and the potential difference signal $\Delta V_S$ across the sense transistor 110 as applied to the differential input terminal pairs of the differential difference amplifier, DDA, 210 are different.

The differential difference amplifier, DDA, 210 drives a control gate of the auxiliary transistor 220. The differential difference amplifier, DDA, 210 compares the potential difference signal $\Delta V_P$ between the drain terminal D and the source terminal $S_P$ of the load transistor 110 and the potential difference signal $\Delta V_S$ between the drain terminal D and the source terminal $S_M$ of the sense transistor 120 and sets the auxiliary transistor 220 by an output voltage signal of the differential difference amplifier, DDA, 210 at a control gate terminal of the auxiliary transistor 220 such that these potential differences match. The output voltage signal of the differential difference amplifier, DDA, 210 drives the control gate terminal of the first auxiliary transistor 220 accordingly.

A load current $I_{load}$ flows through the load transistor 110, when the load 300 is connected through the load path switched conductive by the control voltage signal 500 applied to the control gate G of the load transistor 110, while a measurement current $I_{sense}$ flows through the sense transistor 120, when the sense path is switched conductive by the control voltage signal 500 applied to the control gate G of the sense transistor 120. The sense current $I_{sense}$ flowing through the source-drain path of the auxiliary transistor 220 is proportional to the load current $I_{load}$ flowing through the load 300 and through the source-drain load path of the load transistor 110, respectively:

$$I_{sense} = I_{load}/k,$$

where k is a proportional factor.

For the purpose of detecting the sense current $I_{sense}$, the current measuring arrangement 230, is connected in series with the auxiliary transistor 220. The current measuring arrangement 230 output a signal $Out_M$, which is proportional to the load current $I_{load}$.

Figure 3A:
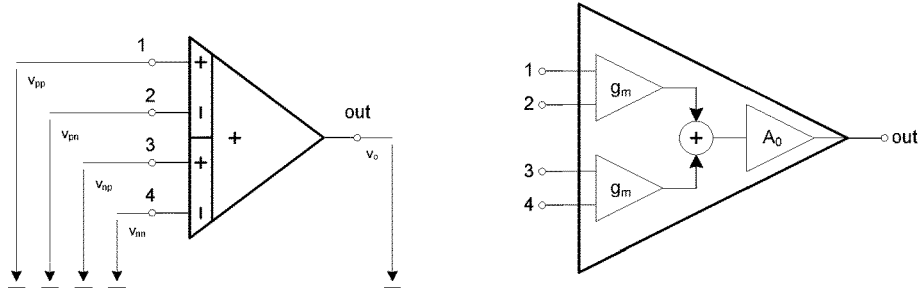
FIGS. 3a and 3b schematically illustrates schematic block diagrams of different differential difference amplifier, DDA, implementations according to examples of the present application is illustrated.

Referring now to FIG. 3a, a schematic block diagram of a differential difference amplifier, DDA, according to an example of the present application is illustrated.

Differential difference amplifiers are described in detail in the following references:

1. A. Soliman: "The Differential Difference Operational Floating Amplifier: A New Block for Analog Signal Processing in MOS Technology" IEEE Transactions on Circuits and Systems II, Vol. 45, No. 1, pp. 148-158, January 1998; and
2. E. Säckinger and W. Guggenbühl: "A Versatile Building Block: The CMOS Differential Difference Amplifier", EEEE Journal of Solid-State Circuits, Vol. SC-22, No. 2, pp. 287-294, April 1987.

For the sake of understanding, a differential difference amplifier may be considered to comprise two input differential amplifiers each having a differential input terminal pair and a (open-loop) gain $g_m$. Each differential input terminal pair is provided for receiving a voltage difference, herein the voltage difference $v_{pp} - v_{pn}$ and the voltage difference $v_{np} - v_{nn}$. The input terminals 1 and 3 are non-inverting input terminals and the input terminals 2 and 4 are inverting input terminal.

In the implementation of the differential difference amplifier described herein with reference to FIG. 3a, a sum signal of the output signals of the input operation amplifiers is amplified by an output operational amplifier with a (open-loop) gain $A_0$. The output signal $v_0$ of the output operational amplifier is $$v_o = A_0[g_m(v_{pp} - v_{pn}) + g_m(v_{np} - v_{nn})].$$

In a closed loop operation, the differential difference amplifier forces two differential voltages to the same value, the basic equation that characterizes the operation of the differential difference amplifier is given by $$v_{pp} - v_{pn} = v_{nn} - v_{np},$$

wherein a feedback signal is introduced at one of the inverting terminals, i.e. at the input terminal 2 contributing to $v_{pn}$ or at the input terminal 4 contributing to $v_{nn}$, and $A_0 \to \infty$.

Figure 3B:
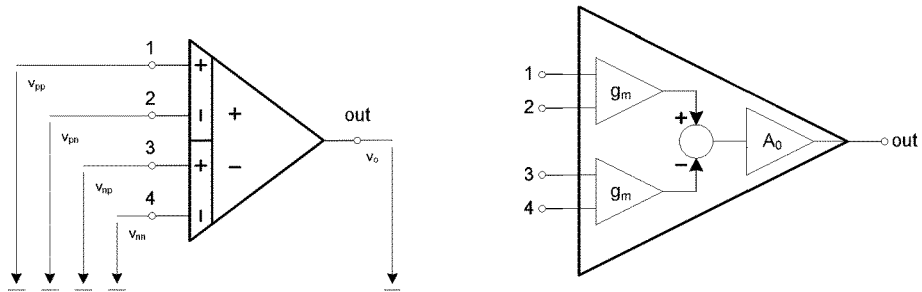

Referring to FIG. 3b, a schematic block diagram of an alternative differential difference amplifier, DDA, according to an example of the present application is illustrated.

Likewise, the alternative implementation of a differential difference amplifier may be considered to comprise two input differential amplifiers each having a differential input terminal pair and a (open-loop) gain $g_m$. Each differential input terminal pair is provided for receiving a voltage difference, herein the first voltage difference $v_{pp} - v_{pn}$ and the second voltage difference $v_{np} - v_{nn}$. The input terminals 1 and 3 are non-inverting input terminals and the input terminals 2 and 4 are inverting input terminal.

In the alternative implementation of the differential difference amplifier described herein with reference to FIG. 3b, a difference signal of the output signals of the input operation amplifiers is amplified by an output operational amplifier with a (open-loop) gain $A_0$.

The output signal $v_o$ of the output operational amplifier is $$v_o = A_0 [g_m(v_{pp} - v_{pn}) - g_m(v_{np} - v_{nn})].$$

In a closed loop operation, the differential difference amplifier forces two differential voltages to the same value, the basic equation that characterizes the operation of the differential difference amplifier is given by $$v_{pp} - v_{pn} = v_{np} - v_{nn},$$

wherein a feedback signal is introduced at one of the input terminals of one differential input terminal pair and $A_0 \to \infty$.

Those skilled in the art will appreciate from the description of the present application that both implementations of a differential difference amplifier may be used.

Figure 4:
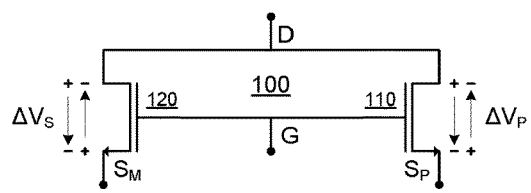
FIG. 4 schematically illustrates a schematic block diagram of an assembly comprising a load transistor and sense transistor according to an example of the present application.

Referring now to FIG. 4, a schematic block diagram of an assembly comprising a load transistor and sense transistor according to an example of the present application is illustrated.

The assembly of load transistor and sense transistor as described throughout the present application may a semiconductor arrangement 100 integrating two separate metal oxide semiconductor field effect transistor (MOSFET) components having a common drain electrode but separate source electrodes. A plurality of transistor cells may be integrated in the semiconductor arrangement 100. At least one transistor cell forms the sense transistor 120 and a multiple of transistor cells form the load transistor 120. The common drain electrode is shared by the transistor cell(s) forming the sense transistor 120 and the transistor cells form the load transistor 120.

The proportional factor k results from the ratio of the current conducting area of the load transistor and the current conducting area of the sense transistor, which is (at least approximately) equivalent to the ratio of the number of transistor cells in the load transistor and the sense transistor, respectively.

Those skilled in the art understand that the present application is not limited to semiconductor arrangement 100 as described above with reference to FIG. 4. The load transistor 110 and the sense transistor 120 may be also implemented in form of insulated-gate bipolar transistors (IGBTs).

Figure 5:
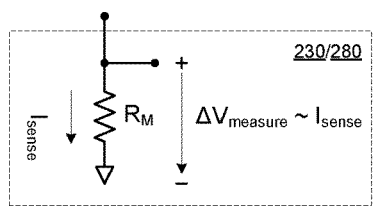
FIG. 5 schematically illustrates a schematic block diagram of a current measuring arrangement according to an example of the present application.

Referring now to FIG. 5, a schematic block diagram of a current measuring arrangement according to an example of the present application is illustrated. The current measuring arrangement 230 is configured to generate an output signal that is representative of the load current $I_{load}$. In the illustrated configuration example, the current measuring arrangement 230 comprises a resistor $R_M$, which is to be connected in series to the sense transistor 120 and the auxiliary transistor 220, respectively. Once the sense current $I_{sense}$ flows through the resistor $R_M$, a voltage drop can be measured across the resistor $R_M$:

$$\Delta V_{measure} = R_M \cdot I_{sense} = R_M \cdot k \cdot I_{load},$$

$$\Rightarrow \Delta V_{measure} \sim I_{load},$$

where $R_M$ is the resistance of the resistor $R_M$ and k is the proportional factor determined by the load and sense transistor design.

Those skilled in the art understand that the current measuring arrangement shown in FIG. 5 is merely exemplary and not intended to limit the present application. Further current measuring arrangements known in the art may be used to measure the sense current $I_{sense}$.

Figure 6:
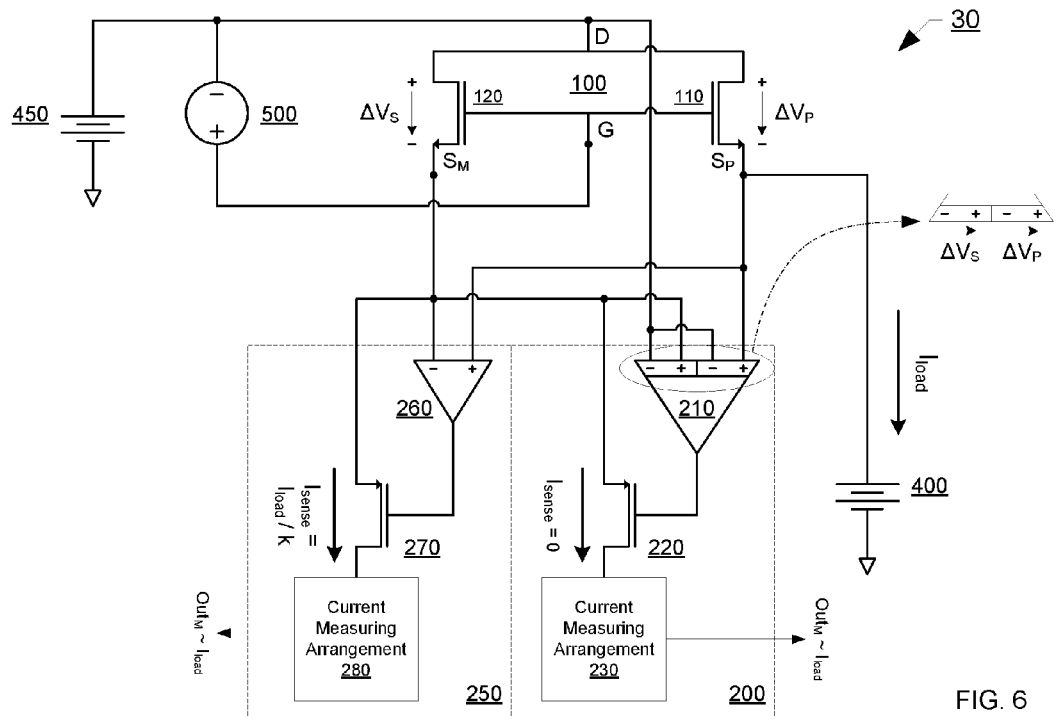
FIGS. 6 and 7 schematically illustrate a block diagram of a further exemplary circuit configuration with a current sense circuit according to an example of the present application.
Figure 7:
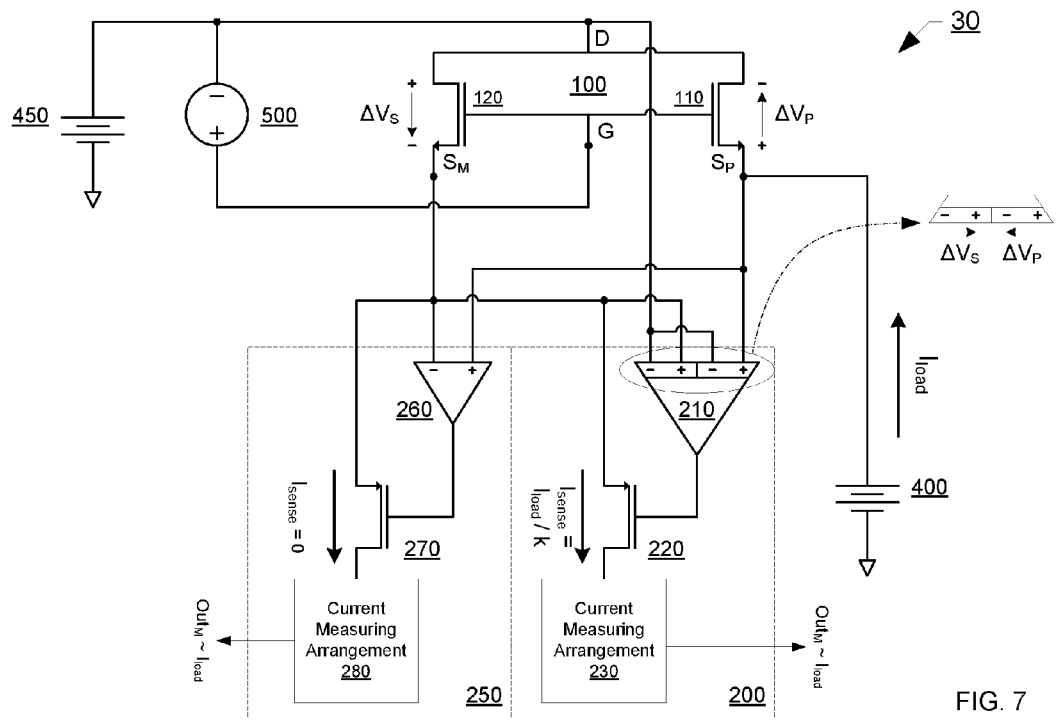

Referring now to FIGS. 6 and 7, a block diagram of a further exemplary circuit configuration with a current sense circuit according to an example of the present application is schematically illustrated. In the example circuit configuration 30, the load current $I_{load}$ may change its flow direction, the load current $I_{load}$ may flow from a current source 450 to a current source 400 as illustrated in FIG. 6 and described below with reference thereto or from the source 400 to the source 450 as illustrated in FIG. 7 and described below with reference thereto. The circuit configuration 30 is implemented to allow for measuring of the load current $I_{load}$ independent of the flow direction.

The exemplary circuit configuration 30 has a load transistor 110, a first current sense circuit 200 and a second current sense circuit 250. The current sense circuits 200 and 205 are coupled to a sense transistor 120. The load transistor 110 and the sense transistor 120 are of the same type and are illustrated as n-conductive MOSFETs by way of example in FIGS. 6 and 7. The load transistor 110 and the sense transistor 120 may be in the form of any other desired transistor components, in particular as IGBTs.

In the example, a first load path terminal of the load transistor 110 is formed by the drain terminal D thereof and a second load path terminal of the transistor 110 is formed by the source terminal $S_P$ thereof. The gate terminal G forms the control terminal of the load transistor 110. The load transistor 110 is connected in series between the source 400 and source 450.

The source 400 and the source 450 apply a voltage at the series circuit between the supply potential $V_{dd1}$ of the source 400 and the supply potential $V_{dd2}$ of the source 450. When the load transistor 110 is enabled by a control voltage signal 500 at its gate terminal G to establish the load path established between drain terminal D and the source terminal $S_P$ thereof, the load current $I_{load}$ is driven by the one of the sources 400 and 450 with the higher supply potential.

The sense transistor 120 likewise has a first sense path terminal, which is formed by the drain terminal D thereof, and a second sense path terminal, which is formed by a source terminal $S_M$ thereof. The control terminal of the sense transistor 120 is formed by the gate terminal G thereof and enables to switch the sense path between the drain terminal D and the source terminal $S_M$ of the sense transistor 120.

The drain terminal D of the sense transistor 120 is connected to the drain terminal D of the load transistor 110. Further, the gate terminal G of the sense transistor 120 is connected to the gate terminal G of the load transistor 110.

For purpose of measuring the load current $I_{load}$ independent of the flow direction, the sense transistor 120 is coupled to a current sense circuit 200 and a current sense circuit 250.

The first current sense circuit 200 has a differential difference amplifier, DDA, 210, a first auxiliary transistor 220 and a first current measurement arrangement 230. In the illustrated example, the first auxiliary transistor 220 is likewise in the form of n-conductive MOSFETs. The drain-source path of the sense transistor 120 is connected in series with the source-drain path of the first auxiliary transistor 220. The differential difference amplifier, DDA, 210 is connected between the drain terminal D and the source terminal $S_P$ of the load transistor 110 and further between the drain terminal D and the source terminal $S_M$ of the sense transistor 120. The differential difference amplifier, DDA, 210 drives a control gate of the first auxiliary transistor 220. In particular, the drain terminal D and the source terminal $S_P$ of the load transistor 110 are connected to a first differential input terminal pair and the drain terminal D and the source terminal $S_M$ of the sense transistor 120 are connected to a second differential input terminal pair. At the first differential input terminal pair, the potential difference signal $\Delta V_P$ between the drain terminal D and the source terminal $S_P$ of the load transistor 110 is applied and at the second differential input terminal pair, the potential difference signal $\Delta V_S$ between the drain terminal D and the source terminal $S_M$ of the sense transistor 120 is applied.

In the illustrated example, in order to allow the differential difference amplifier 210 to drive the control gate of the auxiliary transistor 220 so as to draw the sense current $I_{sense}$ from the source terminal $S_M$ of the sense transistor 120, the source terminal $S_P$ of the load transistor 110 and the source terminal $S_M$ of the sense transistor 120 are connected non-inverting inputs of the first and second differential input terminal pairs of the differential difference amplifier, DDA, 210. The (common) drain terminal(s) D of the load transistor 110 and the sense transistor 120 are connected to inverting inputs of the first and second differential input terminal pairs. The polarities of the potential difference signal $\Delta V_P$ across the load transistor 110 and the potential difference signal $\Delta V_S$ across the sense transistor 110 as applied to the differential input terminal pairs of the differential difference amplifier, DDA, 210 are different.

The differential difference amplifier, DDA, 210 compares the potential difference signal $\Delta V_P$ between the drain terminal D and the source terminal $S_P$ of the load transistor 110 and the potential difference signal $\Delta V_S$ between the drain terminal D and the source terminal $S_M$ of the sense transistor 120 and sets the first auxiliary transistor 220 by an output voltage signal of the differential difference amplifier, DDA, 210 at a control gate terminal of the first auxiliary transistor 220 such that these potential differences match.

The second current sense circuit 250 has a differential amplifier 260, a second auxiliary transistor 270 and a second current measurement arrangement 280. In the illustrated example, the second auxiliary transistor 270 is likewise in the form of n-conductive MOSFETs. The drain-source path of the sense transistor 120 is connected in series with the source-drain path of the second auxiliary transistor 270. The differential amplifier 260 is connected between the source terminal $S_P$ of the load transistor 110 and the source terminal $S_M$ of the sense transistor 120. The differential amplifier 260 drives a control gate of the second auxiliary transistor 270. The differential amplifier 260 compares the voltage potential at the source terminal $S_P$ of the load transistor 110 and the voltage potential at the source terminal $S_M$ of the sense transistor 120.

In FIG. 6, the load current $I_{load}$ flows from the source 450 to the source 400 through the load transistor 110, when enabled by a control voltage signal 500 at its gate terminal G, while a measurement current $I_{sense}$ flows through the sense transistor 120, when the sense path is switched conductive by the control voltage signal 500 applied to the control gate G of the sense transistor 120.

Herein, the flow direction of the load current $I_{load}$ is from the drain terminal D to the source terminal $S_P$ of the load transistor 110 and the flow direction of the sense current $I_{sense}$ is from the drain terminal D to the source terminal $S_M$ of the sense transistor 120; hence, the same current flow direction with respect to drain and source terminals.

The differential amplifier 260 drives the control gate of the second auxiliary transistor 270 so as to draw the sense current $I_{sense}$ from the source terminal $S_M$ of the sense transistor 120. The feedback action of the differential amplifier 260 and the second auxiliary transistor 270 causes the voltage potential at the source terminal $S_M$ of the sense transistor 120 to be held equal to the voltage potential at the source terminal $S_P$ of the load transistor 110. The sense current $I_{sense}$ flowing through the source-drain path of the second auxiliary transistor 270 is hence proportional to the load current $I_{load}$ flowing through the source-drain load path of the load transistor 110:

$$I_{sense} = I_{load}/k,$$

where k is a proportional factor.

For the purpose of detecting the sense current $I_{sense}$, the second current measuring arrangement 280, is connected in series with the second auxiliary transistor 270. The current measuring arrangement 280 output a signal $Out_M$, which is proportional to the load current $I_{load}$.

The differential difference amplifier, DDA, 210 is unable to drive the control gate of the first auxiliary transistor 220 to cause a feedback action, in response to which the potential difference signal $\Delta V_P$ between the drain terminal D and the source terminal $S_P$ of the load transistor 110 and the potential difference signal $\Delta V_S$ between the drain terminal D and the source terminal $S_M$ of the sense transistor 120 are held equal by setting the first auxiliary transistor 220 by the output voltage signal of the differential difference amplifier, DDA, 210 at a control gate terminal of the first auxiliary transistor 220 such that these potential differences match.

In FIG. 7, the load current $I_{load}$ flows from the source 400 to the source 450 through the load transistor 110, when enabled by a control voltage signal 500 at its gate terminal G, while a measurement current $I_{sense}$ flows through the sense transistor 120, when the sense path is switched conductive by the control voltage signal 500 applied to the control gate G of the sense transistor 120.

Herein, the flow direction of the load current $I_{load}$ is from the source terminal $S_P$ to the drain terminal D of the load transistor 110 and the flow direction of the sense current $I_{sense}$ is from the drain terminal D to the source terminal $S_M$ of the sense transistor 120; hence, different current flow directions with respect to drain and source terminals.

The differential difference amplifier, DDA, 210 drives the control gate of the first auxiliary transistor 220 so as to draw the sense current $I_{sense}$ from the source terminal $S_M$ of the sense transistor 120.

The differential difference amplifier, DDA, 210 compares the potential difference signal $\Delta V_P$ between the drain terminal D and the source terminal $S_P$ of the load transistor 110 and the potential difference signal $\Delta V_S$ between the drain terminal D and the source terminal $S_M$ of the sense transistor 120. The feedback action of the differential difference amplifier, DDA, 210 and the first auxiliary transistor 220 causes the potential difference signal $\Delta V_P$ across the load transistor 110 and the potential difference signal $\Delta V_S$ across the sense transistor to be held equal. The feedback action is controlled by the output voltage signal of the differential difference amplifier, DDA, 210 driving the control gate terminal of the first auxiliary transistor 220. The sense current $I_{sense}$ flowing through the source-drain path of the first auxiliary transistor 220 is hence proportional to the load current $I_{load}$ flowing through the source-drain load path of the load transistor 110:

$$I_{sense}=I_{load}/k,$$

where k is a proportional factor.

For the purpose of detecting the sense current $I_{sense}$, the first current measuring arrangement 230, is connected in series with the first auxiliary transistor 220. The current measuring arrangement 230 output a signal $Out_M$, which is proportional to the load current $I_{load}$.

The differential amplifier 260 is unable to drive the control gate of the second auxiliary transistor 270 to cause a feedback action, in response to which the voltage potential at the source terminal $S_P$ of the load transistor 110 and the voltage potential at the source terminal $S_M$ of the sense transistor 120 are held equal by setting the second auxiliary transistor 270 by the output voltage signal of the differential amplifier 260 at a control gate terminal of the first auxiliary transistor 220 such that these potential differences match.

Referring now to FIGS. 6 and 7, a block diagram of yet another exemplary circuit configuration with a current sense circuit according to an example of the present application is schematically illustrated.

Figure 8:
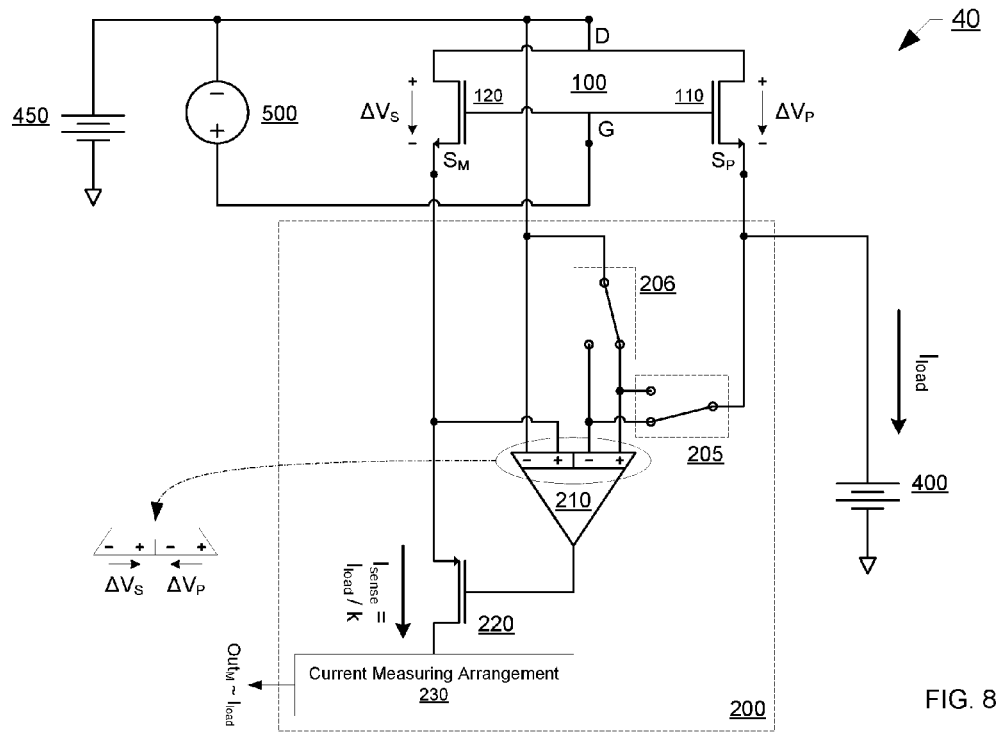
FIGS. 8 and 9 schematically illustrate a block diagram of yet another exemplary circuit configuration with a current sense circuit according to an example of the present application.
Figure 9:
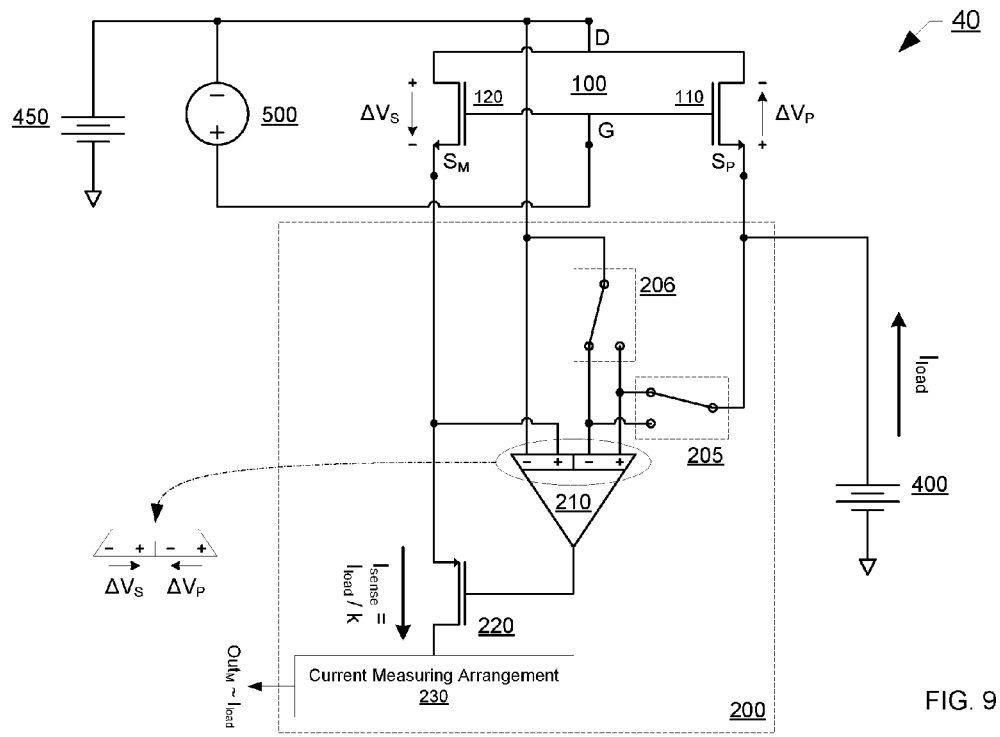

In the example circuit configuration 40, the load current $I_{load}$ may change its flow direction, the load current $I_{load}$ may flow from a current source 450 to a current source 400 as illustrated in FIG. 8 and described below with reference thereto or from the source 400 to the source 450 as illustrated in FIG. 9 and described below with reference thereto. The circuit configuration 40 is implemented to allow for measuring of the load current $I_{load}$ independent of the flow direction.

The exemplary circuit configuration 40 has a load transistor 110 and a current sense circuit 200. The current sense circuit 200 is coupled to a sense transistor 120. The load transistor 110 and the sense transistor 120 are of the same type and are illustrated as n-conductive MOSFETs by way of example in FIGS. 6 and 7. The load transistor 110 and the sense transistor 120 may be in the form of any other desired transistor components, in particular as IGBTs.

In the example, a first load path terminal of the load transistor 110 is formed by the drain terminal D thereof and a second load path terminal of the transistor 110 is formed by the source terminal $S_P$ thereof. The gate terminal G forms the control terminal of the load transistor 110. The load transistor 110 is connected in series between the source 400 and source 450.

The source 400 and the source 450 apply a voltage at the series circuit between the supply potential $V_{dd1}$ of the source 400 and the supply potential $V_{dd2}$ of the source 450. When the load transistor 110 is enabled by a control voltage signal 500 at its gate terminal G to establish the load path established between drain terminal D and the source terminal $S_P$ thereof, the load current $I_{load}$ is driven by the one of the sources 400 and 450 with the higher supply potential.

The sense transistor 120 likewise has a first sense path terminal, which is formed by the drain terminal D thereof, and a second sense path terminal, which is formed by a source terminal $S_M$ thereof. The control terminal of the sense transistor 120 is formed by the gate terminal G thereof and enables to switch the sense path between the drain terminal D and the source terminal $S_M$ of the sense transistor 120.

The drain terminal D of the sense transistor 120 is connected to the drain terminal D of the load transistor 110. Further, the gate terminal G of the sense transistor 120 is connected to the gate terminal G of the load transistor 110.

The current sense circuit 200 has a differential difference amplifier, DDA, 210, an auxiliary transistor 220 and a current measurement arrangement 230. In the illustrated example, the auxiliary transistor 220 is likewise in the form of n-conductive MOSFETs. The drain-source path of the sense transistor 120 is connected in series with the source-drain path of the auxiliary transistor 220. The differential difference amplifier, DDA, 210 is connected between the drain terminal D and the source terminal $S_P$ of the load transistor 110 and further between the drain terminal D and the source terminal $S_M$ of the sense transistor 120. In particular, the drain terminal D and the source terminal $S_P$ of the load transistor 110 are connected to a first differential input terminal pair and the drain terminal D and the source terminal $S_M$ of the sense transistor 120 are connected to a second differential input terminal pair. At the first differential input terminal pair, the potential difference signal $\Delta V_P$ between the drain terminal D and the source terminal $S_P$ of the load transistor 110 is applied and at the second differential input terminal pair, the potential difference signal $\Delta V_S$ between the drain terminal D and the source terminal $S_M$ of the sense transistor 120 is applied.

The differential difference amplifier, DDA, 210 drives a control gate of the first auxiliary transistor 220. The differential difference amplifier, DDA, 210 compares the potential difference signal $\Delta V_P$ at the terminals of the load transistor 110 and the potential difference signal $\Delta V_S$ at the terminals of the sense transistor 120 and sets the first auxiliary transistor 220 by an output voltage signal of the differential difference amplifier, DDA, 210 at a control gate terminal of the first auxiliary transistor 220 such that these potential differences match.

For purpose of measuring the load current $I_{load}$ independent of the flow direction, single-pole, double-throw (SPDT) switches 205 and 206 are arranged to selectively connect the non-inverting terminal of the first differential input terminal pair of the differential difference amplifier, DDA, 210 to the drain terminal D or the source terminal $S_P$ of the load transistor 110 and to selectively connect the inverting terminal of the first differential input terminal pair of the differential difference amplifier, DDA, 210 to the source terminal $S_P$ or the drain terminal D of the load transistor 110. The two single-pole, double-throw (SPDT) switches are arranged to selectively switch the polarity of the potential difference signal $\Delta V_P$ applied to a differential input terminal pair of the differential difference amplifier, DDA, 210.

In FIG. 8, the load current $I_{load}$ flows from the source 450 to the source 400 through the load transistor 110, when enabled by a control voltage signal 500 at its gate terminal G, while a measurement current $I_{sense}$ flows through the sense transistor 120, when the sense path is switched conductive by the control voltage signal 500 applied to the control gate G of the sense transistor 120. Herein, the flow direction of the load current $I_{load}$ is from the drain terminal D to the source terminal $S_P$ of the load transistor 110 and the flow direction of the sense current $I_{sense}$ is from the drain terminal D to the source terminal $S_M$ of the sense transistor 120; hence, the same current flow direction with respect to drain and source terminals.

In order to allow the differential difference amplifier 210 to drive the control gate of the auxiliary transistor 220 so as to draw the sense current $I_{sense}$ from the source terminal $S_M$ of the sense transistor 120, the source terminal $S_P$ of the load transistor 110 and the source terminal $S_M$ of the sense transistor 120 are connected by the single-pole, double-throw (SPDT) switches to a non-inverting input of the first differential input terminal pair of the differential difference amplifier, DDA, 210 and an inverting terminal of the second differential input terminal pair thereof. Likewise the (common) drain terminal(s) D of the load transistor 110 and the sense transistor 120 is are connected by the single-pole, double-throw (SPDT) switches to an inverting input of the first differential input terminal pair of the differential difference amplifier, DDA, 210 and a non-inverting input of the second differential input terminal pair thereof.

The single-pole, double-throw (SPDT) switches are operated to switch the polarity of the potential difference signal $\Delta V_P$ across the load transistor 110 as applied to the first differential input terminal pair of the differential difference amplifier, DDA, 210 such that the polarities of the potential difference signal $\Delta V_P$ across the load transistor 110 and the potential difference signal $\Delta V_S$ across the sense transistor 110 as applied to the differential input terminal pairs are different.

In FIG. 9, the load current $I_{load}$ flows from the source 400 to the source 450 through the load transistor 110, when enabled by a control voltage signal 500 at its gate terminal G, while a measurement current $I_{sense}$ flows through the sense transistor 120, when the sense path is switched conductive by the control voltage signal 500 applied to the control gate G of the sense transistor 120. Herein, the flow direction of the load current $I_{load}$ is from the source terminal $S_P$ to the drain terminal D of the load transistor 110 and the flow direction of the sense current $I_{sense}$ is from the drain terminal D to the source terminal $S_M$ of the sense transistor 120; hence, the different current flow directions with respect to drain and source terminals.

In order to allow the differential difference amplifier 210 to drive the control gate of the auxiliary transistor 220 so as to draw the sense current $I_{sense}$ from the source terminal $S_M$ of the sense transistor 120, the source terminal $S_P$ of the load transistor 110 and the source terminal $S_M$ of the sense transistor 120 are connected by the single-pole, double-throw (SPDT) switches to non-inverting inputs of the first and second differential input terminal pairs of the differential difference amplifier, DDA, 210. Likewise the (common) drain terminal(s) D of the load transistor 110 and the sense transistor 120 are connected by the single-pole, double-throw (SPDT) switches to inverting inputs of the first and second differential input terminal pairs.

The single-pole, double-throw (SPDT) switches are operated to switch the polarity of the potential difference signal $\Delta V_P$ across the load transistor 110 as applied to the first differential input terminal pair of the differential difference amplifier, DDA, 210 such that the polarities of the potential difference signal $\Delta V_P$ across the load transistor 110 and the potential difference signal $\Delta V_S$ across the sense transistor 110 as applied to the differential input terminal pairs are different.

By means of the current flow direction based polarity switching, the feedback action of the differential difference amplifier, DDA, 210 and the auxiliary transistor 220 is enabled to cause the potential difference signal $\Delta V_P$ across the load transistor 110 and the potential difference signal $\Delta V_S$ across the sense transistor 120 to be held equal independent of the current flow direction. The feedback action is controlled by the output voltage signal of the differential difference amplifier, DDA, 210 driving the control gate terminal of the auxiliary transistor 220. The sense current $I_{sense}$ flowing through the source-drain path of the auxiliary transistor 220 is hence proportional to the load current $I_{load}$ flowing through the drain-source/source-drain load path of the load transistor 110:

$$I_{sense} = I_{load}/k$$

where k is a proportional factor.

For the purpose of detecting the sense current $I_{sense}$, the current measuring arrangement 230, is connected in series with the auxiliary transistor 220. The current measuring arrangement 230 output a signal $Out_M$, which is proportional to the value of the load current $I_{load}$. The signal $Out_M$ is independent on the flow direction of the load current $I_{load}$.

It should be noted that the two single-pole, double-throw (SPDT) switches should be understood to represent merely one possible implementation to selectively switch the polarity of the potential difference signal $\Delta V_P$. Alternative switching elements to selectively switch the polarity of the potential difference signal $\Delta V_P$ may be used. Further, switching elements such as the two single-pole, double-throw (SPDT) switches may be arranged to selectively switch the polarity of the potential difference signal $\Delta V_S$ applied to a differential input terminal pair of the differential difference amplifier, DDA, 210. In particular, the two single-pole, double-throw (SPDT) switches may be implemented as one double-pole, double-throw (DPDT) switch.

Alternatively, one or more switching elements to selectively switch the polarity of the potential difference signal $\Delta V_P$ may be used. Moreover A switch operating signal may be generated based on the polarity of the potential difference signal $\Delta V_P$ across the drain terminal D and the source terminal $S_P$ of the load transistor 110, e.g. by using a differential amplifier comparing the voltage potential at the drain terminal D and the voltage potential at the source terminal $S_P$ of the load transistor 110. A hysteresis control may be applied to prevent from fast switching when the voltage potentials of the sources 400 and 450 are almost the same and the current flow direction is substantially unstable (varies at a high frequency). The width of the hysteresis may be adapted to meet a desired measurement resolution of low currents.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, circuits, and algorithm steps described in connection with the disclosure herein may be implemented as electronic hardware, computer software, or combinations of both. To illustrate clearly this interchangeability of hardware and software, various illustrative components, blocks, modules, circuits, and steps have been described above generally in terms of their functionality.

Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

In the claims, any reference signs placed between parentheses shall not be construed as limiting the claim. The word "comprising" does not exclude the presence of other elements or operations then those listed in a claim. Furthermore, the terms "a" or "an", as used herein, are defined as one or as more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an". The same holds true for the use of definite articles. Unless stated otherwise, terms such as "first" and "second" are used to distinguish arbitrarily between the elements such terms describe. Thus, these terms are not necessarily intended to indicate temporal or other prioritization of such elements. The mere fact that certain measures are recited in mutually different claims does not indicate that a combination of these measures cannot be used to advantage.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein but is to be accorded the widest scope consistent with the principles and novel features disclosed herein.

The invention claimed is:

1. A current sense circuit, comprising:
   a differential difference amplifier having a first differential input terminal pair coupled across a drain electrode and a source electrode of a load transistor; and
   a second differential input terminal pair coupled across a drain electrode and a source electrode of a sense transistor,
   wherein the current sense circuit is operable to force a same voltage difference value across the drain electrode and the source electrode of the load transistor as across the drain electrode and the source electrode of the sense transistor to cause a sense current through the sense transistor,
   wherein the sense current is representative of a load current through the load transistor.

2. The current sense circuit according to claim 1, further comprising:
   an auxiliary transistor coupled in series with the sense transistor,
   wherein a control gate electrode of the auxiliary transistor is coupled to the output terminal of the differential difference amplifier, the differential difference amplifier and the auxiliary transistor forming a feedback circuit.

3. The current sense circuit according to claim 2, wherein a source electrode of the auxiliary transistor is coupled to the sense transistor.

4. The current sense circuit according to claim 3,
   wherein the differential difference amplifier is responsively coupled to the source electrode of the sense transistor.

5. The current sense circuit according to claim 1, wherein the current sense circuit is operable to cause the sense current through sense transistor having a current flow direction opposite to the load current through the load transistor with respect to a source-drain path.

6. The current sense circuit according to claim 1,
   wherein the sense current is proportional to the load current.

7. The current sense circuit according to claim 1, further comprising:
   at least one switching element coupled between the source electrode and drain electrode of the load transistor and the first differential input terminal pair and operable to switch a polarity of the first voltage difference signal of the potential difference between the drain electrode and the source electrode of the load transistor dependent on the current flow direction of the load current.

8. The circuit arrangement according to claim 7,
   wherein the at least one switching element comprises one of a double-pole, double-throw (DPDT) switch and two single-pole, double-throw switches.

9. The current sense circuit according to claim 1, further comprising:
   a current measuring arrangement coupled in series with the sense transistor and arranged to output an output signal being representative of the load current.

10. The current sense circuit according to claim 1,
    wherein the output signal is proportional to the load current.

11. A circuit arrangement, comprising
    a load transistor coupled in series with and configured to control a load current to a load;
    a sense transistor that provides a sense current; and
    a current sense circuit coupled in series with the sense transistor, comprising:
    a differential difference amplifier having a first differential input terminal pair coupled across a drain electrode and a source electrode of a load transistor; and
    a second differential input terminal pair coupled across a drain electrode and a source electrode of a sense transistor,
    wherein the current sense circuit is operable to force a same voltage difference value across the drain electrode and the source electrode of the load transistor as across the drain electrode and the source electrode of the sense transistor to cause a sense current through the sense transistor,
    wherein the sense current is representative of a load current through a load transistor.

12. The circuit arrangement according to claim 11,
    wherein a first voltage difference signal of a potential difference between the drain electrode and the source electrode of the load transistor is provided to the first differential input terminal pair,
    wherein a second voltage difference signal of a potential difference between the drain electrode and the source electrode of the sense transistor is provided to the second differential input terminal pair.

13. The circuit arrangement according to claim 11,
    wherein the load transistor and the sense transistor have a common drain electrode.

14. The circuit arrangement according to claim 11, wherein the load transistor and the sense transistor have a common gate electrode.

15. The circuit arrangement according to claim 11, wherein the load transistor and the sense transistor are arranged in an integrated semiconductor device.

16. The circuit arrangement according to claim 11, wherein the load is coupled to the one or the source electrode and the drain electrode of the load transistor.

17. The circuit arrangement according to claim 11, further comprising:
wherein the load transistor and/or the sense transistor is at least one of a field effect transistor, a metal-oxide-semiconductor field effect transistor and an insulated-gate bipolar transistor.

18. The circuit arrangement according to claim 11, further comprising:
another current sense circuit configured to cause the sense current through the sense transistor, the sense current being representative of the load current, the other current sense circuit comprising:
a differential amplifier having
a first input terminal coupled to one of the source and the drain electrode of the load transistor to receive a voltage potential signal thereof; and
a second input terminal coupled to one of the source and the drain electrode of the sense transistor to receive a voltage potential signal thereof,
wherein the other current sense circuit is operable to force the same voltage across the load transistor as across the sense transistor,
wherein the other current sense circuit is operable to cause the sense current through sense transistor having a current flow direction as the load current through the load transistor with respect to a source-drain path.

19. The circuit arrangement according to claim 18, wherein the another current sense circuit further comprises:
an auxiliary transistor coupled in series with the sense transistor,
wherein a control gate electrode of the auxiliary transistor is coupled to the output terminal of the differential amplifier, the differential amplifier and the auxiliary transistor forming a feedback circuit.

* * * * *